(12) United States Patent
Javaheri et al.

(10) Patent No.: US 12,105,432 B2
(45) Date of Patent: Oct. 1, 2024

(54) METROLOGY METHOD AND ASSOCIATED COMPUTER PRODUCT

(71) Applicant: ASML Netherlands B.V., Veldhoven (NL)

(72) Inventors: Narjes Javaheri, Eindhoven (NL); Maurits Van Der Schaar, Eindhoven (NL); Tieh-Ming Chang, Eindhoven (NL); Hilko Dirk Bos, Utrecht (NL); Patrick Warnaar, Tilburg (NL); Samira Bahrami, Amsterdam (NL); Mohammadreza Hajiahmadi, Den Bosch (NL); Sergey Tarabrin, Eindhoven (NL); Mykhailo Semkiv, Veldhoven (NL)

(73) Assignee: ASML Netherlands B.V., Veldhoven (NL)

( * ) Notice: Subject to any disclaimer, the term of this patent is extended or adjusted under 35 U.S.C. 154(b) by 113 days.

(21) Appl. No.: 17/625,640

(22) PCT Filed: Jul. 7, 2020

(86) PCT No.: PCT/EP2020/069139
§ 371 (c)(1),
(2) Date: Jan. 7, 2022

(87) PCT Pub. No.: WO2021/005067
PCT Pub. Date: Jan. 14, 2021

(65) Prior Publication Data
US 2022/0252990 A1     Aug. 11, 2022

Related U.S. Application Data

(60) Provisional application No. 62/871,429, filed on Jul. 8, 2019.

(51) Int. Cl.
*G03F 7/00*     (2006.01)
(52) U.S. Cl.
CPC ................ *G03F 7/70633* (2013.01)
(58) Field of Classification Search
CPC ........... G01B 11/0625; G01B 11/0633; G03F 7/70616; G03F 7/70625; G03F 7/70633
See application file for complete search history.

(56) References Cited

U.S. PATENT DOCUMENTS

| 8,913,237 B2 | 12/2014 | Levinski et al. |
| 9,529,278 B2 | 12/2016 | Van De Kerkhof |

(Continued)

FOREIGN PATENT DOCUMENTS

| JP | 2011-525039 A | 9/2011 |
| JP | 2015-127653 A | 7/2015 |

(Continued)

OTHER PUBLICATIONS

International Search Report and Written Opinion of the International Searching Authority directed to related International Patent Application No. PCT/EP2020/069139, mailed Oct. 14, 2020; 11 pages.

(Continued)

*Primary Examiner* — Deoram Persaud
(74) *Attorney, Agent, or Firm* — Sterne, Kessler, Goldstein & Fox P.L.L.C.

(57) ABSTRACT

Disclosed is a method comprising measuring radiation reflected from a metrology target and decomposing the measured radiation in components, for example Fourier components or spatial components. Further, there is disclosed a recipe selection method which provides an algorithm to select a parameter of the metrology apparatus based on re-calculated dependencies of 5 the measured radiation based on single components.

20 Claims, 8 Drawing Sheets

(56) References Cited

U.S. PATENT DOCUMENTS

| | | |
|---|---|---|
| 10,107,765 B2 | 10/2018 | Sapiens et al. |
| 2006/0066855 A1 | 3/2006 | Den Boef et al. |
| 2011/0027704 A1 | 2/2011 | Cramer et al. |
| 2011/0043791 A1 | 2/2011 | Smilde et al. |
| 2011/0080585 A1 | 4/2011 | Rabello et al. |
| 2012/0242970 A1 | 9/2012 | Smilde et al. |
| 2015/0043803 A1 | 2/2015 | Jeong |
| 2015/0192858 A1 | 7/2015 | Van De Kerkhof |
| 2016/0047744 A1 | 2/2016 | Adel et al. |
| 2018/0088470 A1 | 3/2018 | Bhattacharyya et al. |
| 2019/0094711 A1 | 3/2019 | Atkins et al. |
| 2019/0107781 A1 | 4/2019 | Tinnemans et al. |
| 2019/0155173 A1 | 5/2019 | Tsiatmas et al. |

FOREIGN PATENT DOCUMENTS

| | | |
|---|---|---|
| JP | 2015-528922 A | 10/2015 |
| JP | 2017-523591 A | 8/2017 |
| TW | 201925910 A | 7/2019 |
| WO | WO 2009/078708 A1 | 6/2009 |
| WO | WO 2009/106279 A1 | 9/2009 |
| WO | WO 2011/012624 A1 | 2/2011 |
| WO | WO 2015/082158 A1 | 6/2015 |
| WO | WO 2019/015995 A1 | 1/2019 |

OTHER PUBLICATIONS

International Preliminary Report on Patentability directed to related International Patent Application No. PCT/EP2020/069139, issued Jan. 11, 2022; 8 pages.

Notice of Reasons for Refusal directed to Japanese Patent Application No. 2022-500749, mailed Oct. 4, 2023; 12 pages.

Japanese Decision of Dismissal of Amendment directed to Japanese Patent Application No. 2022500749, mailed Mar. 15, 2024; 5 pages.

METROLOGY METHOD AND ASSOCIATED COMPUTER PRODUCT

FIELD

The present invention relates to a method and computer product for metrology usable, for example, in the manufacture of devices by a lithographic technique.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., including part of, one, or several dies) on a substrate (e.g., a silicon wafer). Transfer of the pattern is typically via imaging onto a layer of radiation-sensitive material (resist) provided on the substrate. In general, a single substrate will contain a network of adjacent target portions that are successively patterned.

In a lithographic process (i.e., a process of developing a device or other structure involving lithographic exposure, which may typically include one or more associated processing steps such as development of resist, etching, etc.), it is desirable frequently to make measurements of structures created, e.g., for process control and verification. Various tools for making such measurements are known, including scanning electron microscopes, which are often used to measure critical dimension (CD), and specialized tools to measure overlay, the accuracy of alignment of two layers of a substrate. Recently, various forms of scatterometers have been developed for use in the lithographic field. These devices direct a beam of radiation onto a target and measure one or more properties of the scattered radiation—e.g., intensity at a single angle of reflection as a function of wavelength; intensity at one or more wavelengths as a function of reflected angle; or polarization as a function of reflected angle—to obtain a "spectrum" from which a property of interest of the target can be determined. Determination of the property of interest may be performed by various techniques: e.g., reconstruction of the target structure by iterative approaches such as rigorous coupled wave analysis or finite element methods; library searches; and principal component analysis.

SUMMARY

In metrology application, for example in overlay metrology, radiation from a source impinges on a target comprising an overlapping grating, and the reflected radiation is detected on a sensor. The reflected radiation is the result of the combination of various parts of the impinging radiation as they propagate (reflected or transmitted) through the metrology target. In the presence of grating asymmetries, for example grating geometrical asymmetries, the reflected radiation contains information about these asymmetries as well, which may mask the information due to the overlay between the overlapping gratings. Furthermore, realistic gratings may have asymmetries such as tilt. It may be desirable to be able to measure overlay or any other parameter of interest of a lithographic process in such a way that it is invariant to the asymmetries present in real metrology gratings.

In a first aspect of the invention there is provided a method comprising measuring radiation reflected from a metrology target and decomposing the measured radiation in components.

In a second aspect of the invention there is provided a method to measure a parameter of a lithographic process comprising a) illuminating a metrology target with radiation, b) detecting scattered radiation from the target, c) changing a parameter of the metrology apparatus, d) repeating steps a) to c) for a multitude of values of the parameter of the metrology apparatus, and e) decomposing the radiation into components.

In a third aspect of the invention there is provided a method to measure a parameter of a lithographic process comprising a) illuminating a metrology target with radiation, b) detecting scattered radiation from the target, c) changing a parameter of the metrology apparatus, d) repeating steps a) to c) for a multitude of values of the parameter of the metrology apparatus, e) applying a filter to the measurement obtained in step d).

In a forth aspect of the invention there is provided a method of characterizing a lithographic process comprising obtaining a 3D asymmetry map of the bottom grating at a first target location, repeating obtaining the 3D asymmetry map for a multitude of targets, and obtaining based on the above measurement a map of target asymmetries for a wafer.

In a fifth aspect of the invention, there is provided a method to select a parameter of a metrology apparatus comprising obtaining a first plurality of measurements at a first plurality of values of a parameter of a metrology apparatus and calculating a minimum second number of measurements and second values of the parameter of the metrology apparatus associated thereof such that the second values of the parameter of the metrology apparatus are less that the first values of the parameter of the metrology apparatus.

Another aspect of the invention comprises a computer program and associated computer program carrier for performing the method of the first aspect.

BRIEF DESCRIPTION OF THE DRAWINGS

Embodiments of the invention will now be described, by way of example only, with reference to the accompanying drawings in which.

DETAILED DESCRIPTION

Before describing embodiments in detail, it is instructive to present an example environment in which embodiments may be implemented.

Figure 1:
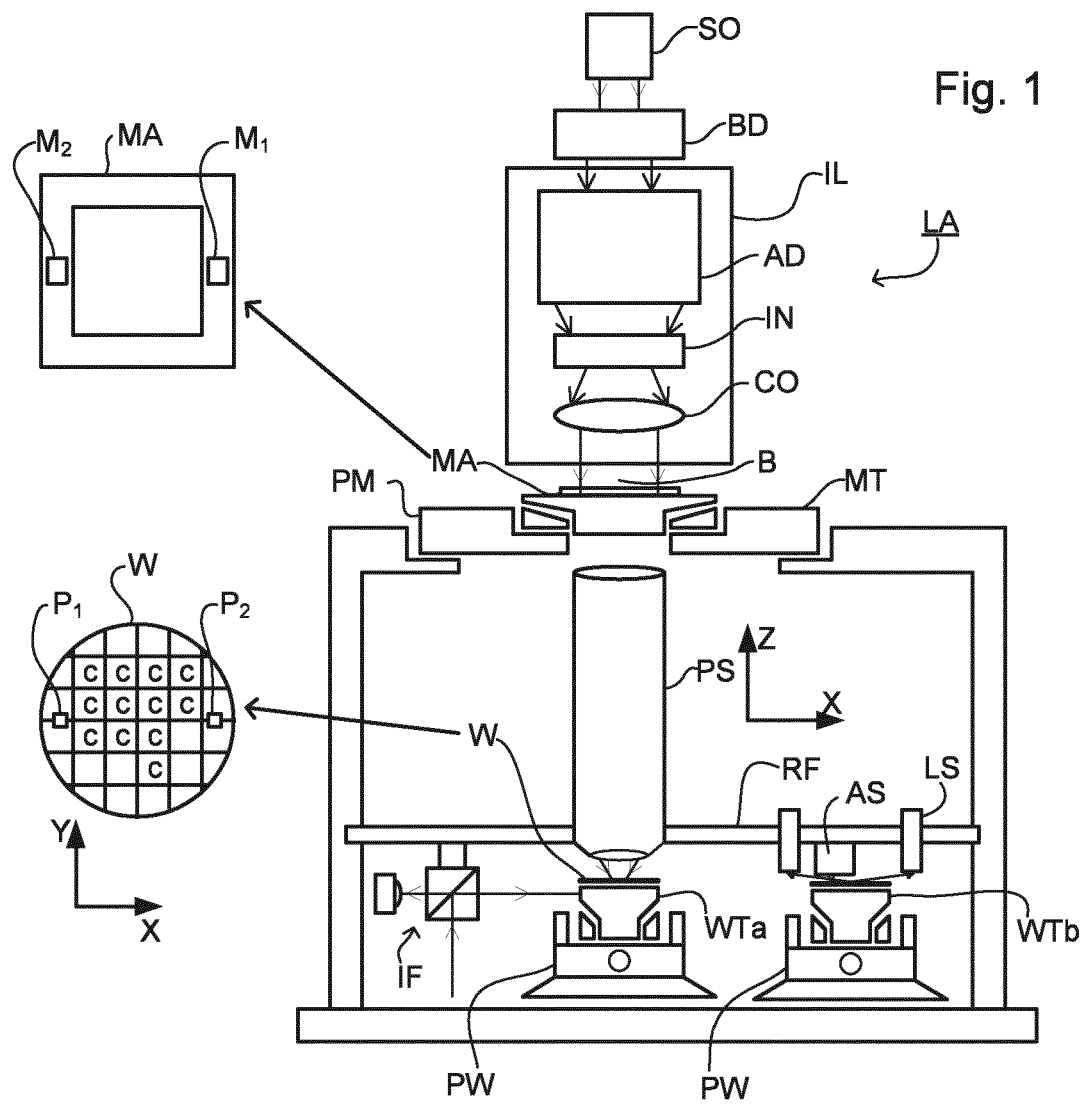
FIG. 1 depicts a lithographic apparatus according to an embodiment of the invention.

FIG. 1 schematically depicts a lithographic apparatus LA. The apparatus includes an illumination system (illuminator) IL configured to condition a radiation beam B (e.g., UV radiation or DUV radiation), a patterning device support or support structure (e.g., a mask table) MT constructed to support a patterning device (e.g., a mask) MA and connected to a first positioner PM configured to accurately position the patterning device in accordance with certain parameters; a substrate table (e.g., a wafer table) WT constructed to hold a substrate (e.g., a resist coated wafer) W and connected to a second positioner PW configured to accurately position the substrate in accordance with certain parameters; and a projection system (e.g., a refractive projection lens system) PS configured to project a pattern imparted to the radiation beam B by patterning device MA onto a target portion C (e.g., including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support holds the patterning device in a manner that depends on the orientation of the patterning device, the design of the lithographic apparatus, and other conditions, such as for example whether or not the patterning device is held in a vacuum environment. The patterning device support can use mechanical, vacuum, electrostatic or other clamping techniques to hold the patterning device. The patterning device support may be a frame or a table, for example, which may be fixed or movable as required. The patterning device support may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam, which is reflected by the mirror matrix.

As here depicted, the apparatus is of a transmissive type (e.g., employing a transmissive mask). Alternatively, the apparatus may be of a reflective type (e.g., employing a programmable mirror array of a type as referred to above, or employing a reflective mask).

The lithographic apparatus may also be of a type wherein at least a portion of the substrate may be covered by a liquid having a relatively high refractive index, e.g., water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the patterning device support (e.g., mask table MT), and is patterned by the patterning device. Having traversed the patterning device (e.g., mask) MA, the radiation beam B passes through the projection system PS, which focuses the beam onto a target portion C of the substrate W. With the aid of the second positioner PW and position sensor IF (e.g., an interferometric device, linear encoder, 2-D encoder or capacitive sensor), the substrate table WT can be moved accurately, e.g., so as to position different target portions C in the path of the radiation beam B Similarly, the first positioner PM and another position sensor (which is not explicitly depicted in FIG. 1) can be used to accurately position the patterning device (e.g., mask) MA with respect to the path of the radiation beam B, e.g., after mechanical retrieval from a mask library, or during a scan.

Patterning device (e.g., mask) MA and substrate W may be aligned using mask alignment marks $M_1$, $M_2$ and substrate alignment marks $P_1$, $P_2$. Although the substrate alignment marks as illustrated occupy dedicated target portions, they may be located in spaces between target portions (these are known as scribe-lane alignment marks). Similarly, in situations in which more than one die is provided on the patterning device (e.g., mask) MA, the mask alignment marks may be located between the dies. Small alignment markers may also be included within dies, in amongst the device features, in which case it is desirable that the markers be as small as possible and not require any different imaging or process conditions than adjacent features. An embodiment of an alignment system, which can detect the alignment markers, is described further below.

The depicted apparatus could be used in at least one of the following modes:

1. In step mode, the patterning device support (e.g., mask table) MT and the substrate table WTa are kept essentially stationary, while an entire pattern imparted to the radiation beam is projected onto a target portion C at one time (i.e., a single static exposure). The substrate table WTa is then shifted in the X and/or Y direction so that a different target portion C can be exposed. In step mode, the maximum size of the exposure field limits the size of the target portion C imaged in a single static exposure.

2. In scan mode, the patterning device support (e.g., mask table) MT and the substrate table WTa are scanned synchronously while a pattern imparted to the radiation beam is projected onto a target portion C (i.e., a single dynamic exposure). The velocity and direction of the substrate table WTa relative to the patterning device support (e.g., mask table) MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device support (e.g., mask table) MT is kept essentially stationary holding a programmable patterning device, and the substrate table WTa is moved or scanned while a pattern imparted to the radiation beam is projected onto a target portion C. In this mode, generally a pulsed radiation source is employed and the programmable patterning device is updated as required after each movement of the substrate table WTa or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA is of a so-called dual stage type which has two tables WTa, WTb (e.g., two substrate tables) and two stations—an exposure station and a measurement station—between which the tables can be exchanged. For example, while a substrate on one table is being exposed at the exposure station, another substrate can be loaded onto the other substrate table at the measurement station and various preparatory steps carried out. The preparatory steps may include mapping the surface control of the substrate using a level sensor LS and measuring the position of alignment markers on the substrate using an alignment sensor AS, both sensors being supported by a reference frame RF. If the position sensor IF is not capable of measuring the position of a table while it is at the measurement station as well as at the exposure station, a second position sensor may be provided to enable the positions of the table to be tracked at both stations. As another example, while a substrate on one table is being exposed at the exposure station, another table without a substrate waits at the measurement station (where optionally measurement activity may occur). This other table has one or more measurement devices and may optionally have other tools (e.g., cleaning apparatus). When the substrate has completed exposure, the table without a substrate moves to the exposure station to perform, e.g., measurements and the table with the substrate moves to a location (e.g., the measurement station) where the substrate is unloaded and another substrate is load. These multi-table arrangements enable a substantial increase in the throughput of the apparatus.

Figure 2:
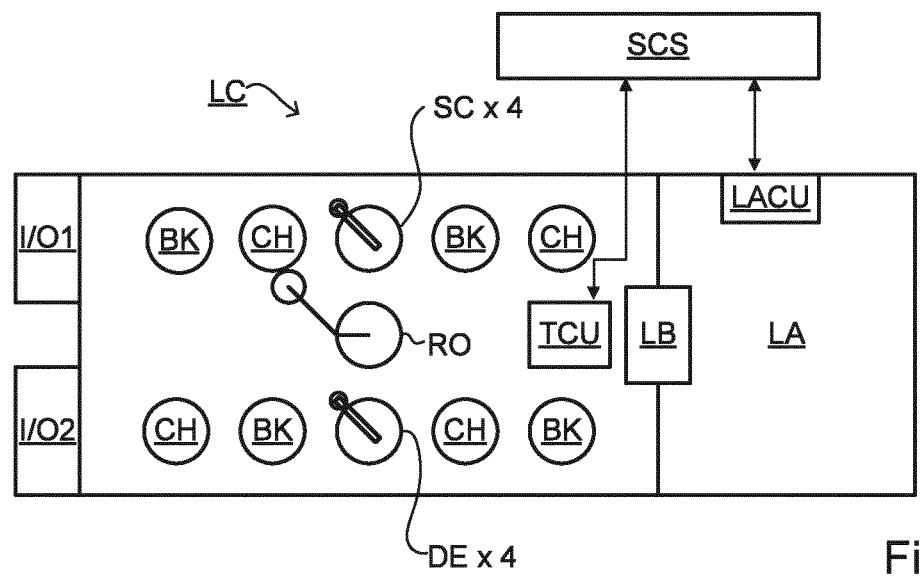
FIG. 2 depicts a lithographic cell or cluster according to an embodiment of the invention.

As shown in FIG. 2, the lithographic apparatus LA forms part of a lithographic cell LC, also sometimes referred to as a lithocell or lithocluster, which also includes apparatus to perform one or more pre- and post-exposure processes on a substrate. Conventionally these include one or more spin coaters SC to deposit a resist layer, one or more developers DE to develop exposed resist, one or more chill plates CH and one or more bake plates BK. A substrate handler, or robot, RO picks up a substrate from input/output ports I/O1, I/O2, moves it between the different process devices and delivers it to the loading bay LB of the lithographic apparatus. These devices, which are often collectively referred to as the track, are under the control of a track control unit TCU which is itself controlled by the supervisory control system SCS, which also controls the lithographic apparatus via lithographic control unit LACU. Thus, the different apparatus may be operated to maximize throughput and processing efficiency.

In order that the substrate that is exposed by the lithographic apparatus is exposed correctly and consistently, it is desirable to inspect an exposed substrate to measure one or more properties such as overlay error between subsequent layers, line thickness, critical dimension (CD), etc. If an error is detected, an adjustment may be made to an exposure of one or more subsequent substrates, especially if the inspection can be done soon and fast enough that another substrate of the same batch is still to be exposed. Also, an already exposed substrate may be stripped and reworked (to improve yield) or discarded, thereby avoiding performing an exposure on a substrate that is known to be faulty. In a case where only some target portions of a substrate are faulty, a further exposure may be performed only on those target portions which are good. Another possibility is to adapt a setting of a subsequent process step to compensate for the error, e.g. the time of a trim etch step can be adjusted to compensate for substrate-to-substrate CD variation resulting from the lithographic process step.

An inspection apparatus is used to determine one or more properties of a substrate, and in particular, how one or more properties of different substrates or different layers of the same substrate vary from layer to layer and/or across a substrate. The inspection apparatus may be integrated into the lithographic apparatus LA or the lithocell LC or may be a stand-alone device. To enable most rapid measurements, it is desirable that the inspection apparatus measure one or more properties in the exposed resist layer immediately after the exposure. However, the latent image in the resist has a very low contrast—there is only a very small difference in refractive index between the part of the resist which has been exposed to radiation and that which has not—and not all inspection apparatus have sufficient sensitivity to make useful measurements of the latent image. Therefore measurements may be taken after the post-exposure bake step (PEB) which is customarily the first step carried out on an exposed substrate and increases the contrast between exposed and unexposed parts of the resist. At this stage, the image in the resist may be referred to as semi-latent. It is also possible to make measurements of the developed resist image—at which point either the exposed or unexposed parts of the resist have been removed—or after a pattern transfer step such as etching. The latter possibility limits the possibility for rework of a faulty substrate but may still provide useful information, e.g. for the purpose of process control.

A target used by a conventional scatterometer comprises a relatively large periodic structure layout (e.g., comprising one or more gratings), e.g., 40 μm by 40 μm. In that case, the measurement beam often has a spot size that is smaller than the periodic structure layout (i.e., the layout is underfilled such that one or more of the periodic structures is not completely covered by the spot). This simplifies mathematical reconstruction of the target as it can be regarded as infinite. However, for example, so the target can be positioned in among product features, rather than in the scribe lane, the size of a target has been reduced, e.g., to 20 μm by 20 μm or less, or to 10 μm by 10 μm or less. In this situation, the periodic structure layout may be made smaller than the measurement spot (i.e., the periodic structure layout is overfilled). Typically such a target is measured using dark field scatterometry in which the zeroth order of diffraction (corresponding to a specular reflection) is blocked, and only higher orders processed. Examples of dark field metrology can be found in PCT patent application publication nos. WO 2009/078708 and WO 2009/106279, which are hereby incorporated in their entirety by reference. Further developments of the technique have been described in U.S. patent application publications US2011-0027704, US2011-0043791 and US2012-0242970, which are hereby incorporated in their entirety by reference. Diffraction-based overlay (DBO or μDBO) using dark-field detection of the diffraction orders enables overlay measurements on smaller targets. These targets can be smaller than the illumination spot and may be surrounded by product structures on a substrate. In an embodiment, multiple targets can be measured in one image.

In an embodiment, the target on a substrate may comprise one or more 1-D periodic gratings, which are printed such that after development, the bars are formed of solid resist lines. In an embodiment, the target may comprise one or more 2-D periodic gratings, which are printed such that after development, the one or more gratings are formed of solid resist pillars or vias in the resist. The bars, pillars or vias may alternatively be etched into the substrate. The pattern of the grating is sensitive to chromatic aberrations in the lithographic projection apparatus, particularly the projection system PL, and illumination symmetry and the presence of such aberrations will manifest themselves in a variation in the printed grating. Accordingly, the measured data of the printed gratings can be used to reconstruct the gratings. The parameters of the 1-D grating, such as line widths and shapes, or parameters of the 2-D grating, such as pillar or via widths or lengths or shapes, may be input to the reconstruction process, performed by processing unit PU, from knowledge of the printing step and/or other measurement processes.

Figure 3A:
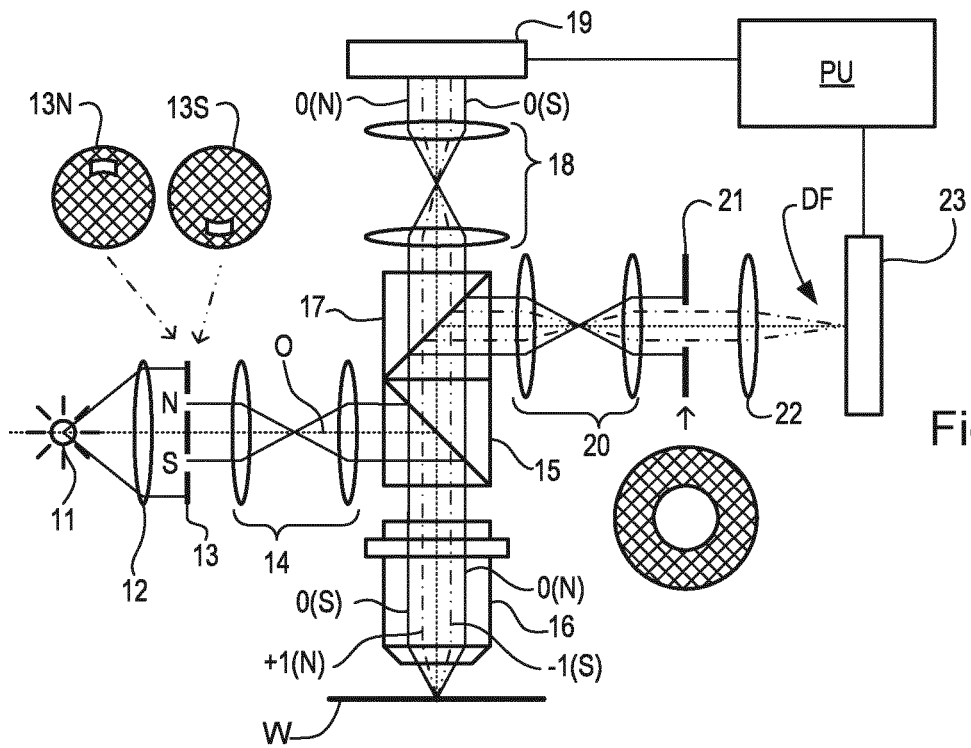
FIG. 3(a) is schematic diagram of a dark field measurement apparatus for use in measuring targets according to embodiments of the invention using a first pair of illumination apertures providing certain illumination modes.

A dark field metrology apparatus suitable for use in embodiments of the invention is shown in FIG. 3(a). A target T (comprising a periodic structure such as a grating) and diffracted rays are illustrated in more detail in FIG. 3(b). The dark field metrology apparatus may be a stand-alone device or incorporated in either the lithographic apparatus LA, e.g., at the measurement station, or the lithographic cell LC. An optical axis, which has several branches throughout the apparatus, is represented by a dotted line O. In this apparatus, radiation emitted by an output 11 (e.g., a source such as a laser or a xenon lamp or an opening connected to a source) is directed onto substrate W via a prism 15 by an optical system comprising lenses 12, 14 and objective lens 16. These lenses are arranged in a double sequence of a 4F arrangement. A different lens arrangement can be used, provided that it still provides a substrate image onto a detector.

In an embodiment, the lens arrangement allows for access of an intermediate pupil-plane for spatial-frequency filtering. Therefore, the angular range at which the radiation is incident on the substrate can be selected by defining a spatial intensity distribution in a plane that presents the spatial spectrum of the substrate plane, here referred to as a (conjugate) pupil plane. In particular, this can be done, for example, by inserting an aperture plate 13 of suitable form between lenses 12 and 14, in a plane which is a back-projected image of the objective lens pupil plane. In the example illustrated, aperture plate 13 has different forms, labeled 13N and 13S, allowing different illumination modes to be selected. The illumination system in the present examples forms an off-axis illumination mode. In the first illumination mode, aperture plate 13N provides off-axis illumination from a direction designated, for the sake of description only, as 'north'. In a second illumination mode, aperture plate 13S is used to provide similar illumination, but from an opposite direction, labeled 'south'. Other modes of illumination are possible by using different apertures. The rest of the pupil plane is desirably dark as any unnecessary radiation outside the desired illumination mode may interfere with the desired measurement signals.

Figures 3B, 3C, 3D:
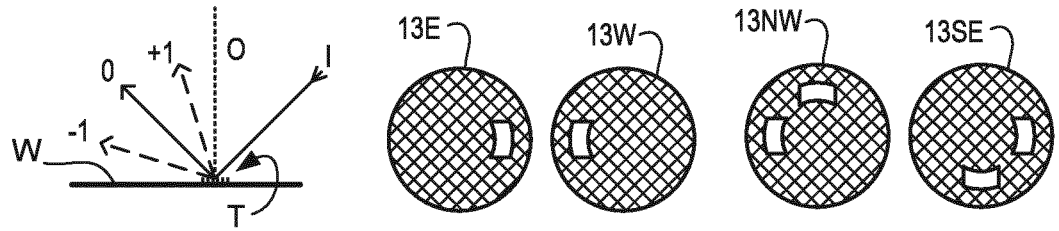
FIG. 3(b) is a schematic detail of a diffraction spectrum of a target for a given direction of illumination.
FIG. 3(c) is a schematic illustration of a second pair of illumination apertures providing further illumination modes in using a measurement apparatus for diffraction based overlay measurements.
FIG. 3(d) is a schematic illustration of a third pair of illumination apertures combining the first and second pairs of apertures providing further illumination modes in using a measurement apparatus for diffraction based overlay measurements.

As shown in FIG. 3(b), target T is placed with substrate W substantially normal to the optical axis O of objective lens 16. A ray of illumination I impinging on target T from an angle off the axis O gives rise to a zeroth order ray (solid line 0) and two first order rays (dot-chain line +1 and double dot-chain line −1). With an overfilled small target T, these rays are just one of many parallel rays covering the area of the substrate including metrology target T and other features. Since the aperture in plate 13 has a finite width (necessary to admit a useful quantity of radiation), the incident rays I will in fact occupy a range of angles, and the diffracted rays 0 and +1/−1 will be spread out somewhat. According to the point spread function of a small target, each order +1 and −1 will be further spread over a range of angles, not a single ideal ray as shown. Note that the periodic structure pitch and illumination angle can be designed or adjusted so that the first order rays entering the objective lens are closely aligned with the central optical axis. The rays illustrated in FIGS. 3(a) and 3(b) are shown somewhat off axis, purely to enable them to be more easily distinguished in the diagram.

At least the 0 and +1 orders diffracted by the target on substrate W are collected by objective lens 16 and directed back through prism 15. Returning to FIG. 3(a), both the first and second illumination modes are illustrated, by designating diametrically opposite apertures labeled as north (N) and south (S). When the incident ray I is from the north side of the optical axis, that is when the first illumination mode is applied using aperture plate 13N, the +1 diffracted rays, which are labeled +1(N), enter the objective lens 16. In contrast, when the second illumination mode is applied using aperture plate 13S the −1 diffracted rays (labeled −1(S)) are the ones which enter the lens 16. Thus, in an embodiment, measurement results are obtained by measuring the target twice under certain conditions, e.g., after rotating the target or changing the illumination mode or changing the imaging mode to obtain separately the −1st and the +1st diffraction order intensities. Comparing these intensities for a given target provides a measurement of asymmetry in the target, and asymmetry in the target can be used as an indicator of a parameter of a lithography process, e.g., overlay error. In the situation described above, the illumination mode is changed.

A beam splitter 17 divides the diffracted beams into two measurement branches. In a first measurement branch, optical system 18 forms a diffraction spectrum (pupil plane image) of the target on first sensor 19 (e.g. a CCD or CMOS sensor) using the zeroth and first order diffractive beams. Each diffraction order hits a different point on the sensor, so that image processing can compare and contrast orders. The pupil plane image captured by sensor 19 can be used for focusing the metrology apparatus and/or normalizing intensity measurements of the first order beam. The pupil plane image can also be used for many measurement purposes such as reconstruction, which are not described in detail here.

In the second measurement branch, optical system 20, 22 forms an image of the target on the substrate W on sensor 23 (e.g. a CCD or CMOS sensor). In the second measurement branch, an aperture stop 21 is provided in a plane that is conjugate to the pupil-plane. Aperture stop 21 functions to block the zeroth order diffracted beam so that the image DF of the target formed on sensor 23 is formed from the −1 or +1 first order beam. The images captured by sensors 19 and 23 are output to image processor and controller PU, the function of which will depend on the particular type of measurements being performed. Note that the term 'image' is used here in a broad sense. An image of the periodic structure features (e.g., grating lines) as such will not be formed, if only one of the −1 and +1 orders is present.

The particular forms of aperture plate 13 and stop 21 shown in FIG. 3 are purely examples. In another embodiment of the invention, on-axis illumination of the targets is used and an aperture stop with an off-axis aperture is used to pass substantially only one first order of diffracted radiation to the sensor. In yet other embodiments, 2nd, 3rd and higher order beams (not shown in FIG. 3) can be used in measurements, instead of or in addition to the first order beams.

In order to make the illumination adaptable to these different types of measurement, the aperture plate 13 may comprise a number of aperture patterns formed around a disc, which rotates to bring a desired pattern into place. Note that aperture plate 13N or 13S are used to measure a periodic structure of a target oriented in one direction (X or Y depending on the set-up). For measurement of an orthogonal periodic structure, rotation of the target through 90° and 270° might be implemented. Different aperture plates are shown in FIGS. 3(c) and (d). FIG. 3(c) illustrates two further types of off-axis illumination mode. In a first illumination mode of FIG. 3(c), aperture plate 13E provides off-axis illumination from a direction designated, for the sake of description only, as 'east' relative to the 'north' previously described. In a second illumination mode of FIG. 3(c), aperture plate 13 W is used to provide similar illumination, but from an opposite direction, labeled 'west'. FIG. 3(d) illustrates two further types of off-axis illumination mode. In a first illumination mode of FIG. 3(d), aperture plate 13NW provides off-axis illumination from the directions designated 'north' and 'west' as previously described. In a second illumination mode, aperture plate 13SE is used to provide similar illumination, but from an opposite direction, labeled 'south' and 'east' as previously described. The use of these, and numerous other variations and applications of the apparatus are described in, for example, the prior published patent application publications mentioned above.

Figure 4:
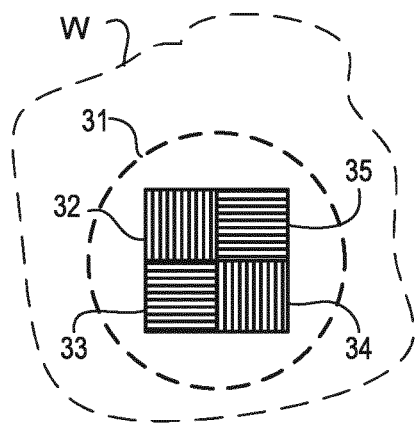
FIG. 4 depicts a form of multiple periodic structure (e.g., multiple grating) target and an outline of a measurement spot on a substrate.

FIG. 4 depicts an example composite metrology target formed on a substrate. The composite target comprises four periodic structures (in this case, gratings) 32, 33, 34, 35 positioned closely together. In an embodiment, the periodic structures are positioned closely together enough so that they all are within a measurement spot 31 formed by the illumination beam of the metrology apparatus. In that case, the four periodic structures thus are all simultaneously illuminated and simultaneously imaged on sensors 19 and 23. In an example dedicated to overlay measurement, periodic structures 32, 33, 34, 35 are themselves composite periodic structures (e.g., composite gratings) formed by overlying periodic structures, i.e., periodic structures are patterned in different layers of the device formed on substrate W and such that at least one periodic structure in one layer overlays at least one periodic structure in a different layer. Such a target may have outer dimensions within 20 µm×20 µm or within 16 µm. Further, all the periodic structures are used to measure overlay between a particular pair of layers. To facilitate a target being able to measure more than a single pair of layers, periodic structures 32, 33, 34, 35 may have differently biased overlay offsets in order to facilitate measurement of overlay between different layers in which the different parts of the composite periodic structures are formed. Thus, all the periodic structures for the target on the substrate would be used to measure one pair of layers and all the periodic structures for another same target on the substrate would be used to measure another pair of layers, wherein the different bias facilitates distinguishing between the layer pairs. The meaning of overlay bias will be explained below, particularly with reference to FIG. 7.

Figure 7A:
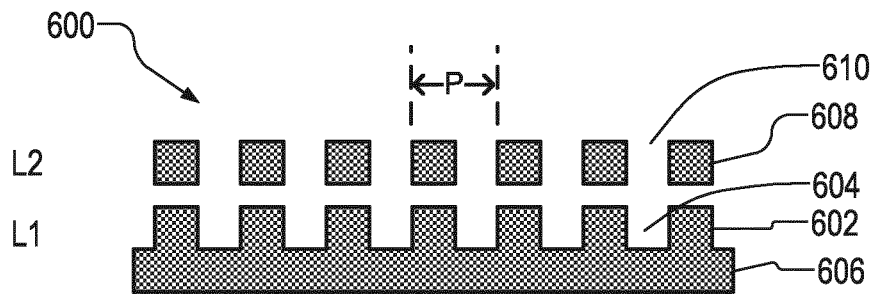
FIGS. 7(a) to 7(d) show schematic cross-sections of overlay periodic structures (e.g., gratings) having different overlay values in the region of zero.
Figure 7B:
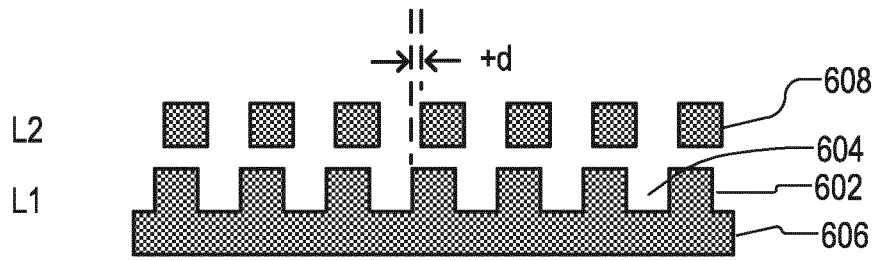
Figure 7C:
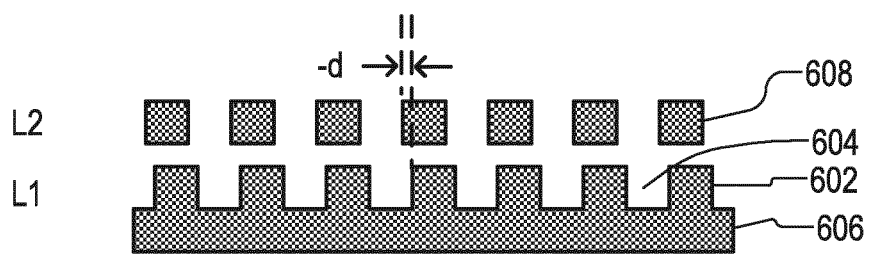
Figure 7D:
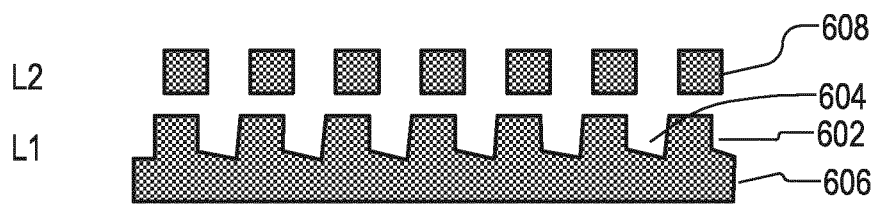

FIGS. 7(a)-(c) show schematic cross sections of overlay periodic structures (in this case gratings) of respective targets T, with different biases. These can be used on substrate W, as seen in FIGS. 3 and 4. Periodic structures with periodicity in the X direction are shown for the sake of example only. Different combinations of these periodic structures with different biases and with different orientations can be provided.

Starting with FIG. 7(a), a composite overlay target 600 formed in two layers, labeled L1 and L2, is depicted. In the bottom layer L1, a first periodic structure (in this case a grating) is formed by features (e.g., lines) 602 and spaces 604 on a substrate 606. In layer L2, a second periodic structure (in this case a grating) is formed by features (e.g., lines) 608 and spaces 610. (The cross-section is drawn such that the features 602, 608 extend into the page.) The periodic structure pattern repeats with a pitch P in both layers. Lines 602 and 608 are mentioned for the sake of example only, other types of features such as dots, blocks and via holes can be used. In the situation shown at FIG. 7(a), there is no overlay error and no bias, so that each feature 608 lies exactly over a feature 602 in the bottom periodic structure (where the measurement is "line-on-line"—in an embodiment, no overlay error may occur where each feature 608 lies exactly over a space 610 wherein the measurement is "line-on-trench").

At FIG. 7(b), the same target with a bias +d is depicted such that the features 608 of the upper periodic structure are shifted by a distance d to the right (the distance d being less than the pitch P), relative to the features 602 of the lower periodic structures. That is, features 608 and features 602 are arranged so that if they were both printed exactly at their nominal locations, features 608 would be offset relative to the features 602 by the distance d. The bias distance d might be a few nanometers in practice, for example 10 nm 20 nm, while the pitch P is for example in the range 300-1000 nm, for example 500 nm or 600 nm. At FIG. 7(c), the same target with a bias −d is depicted such that the features 608 are shifted to the left relative to the features 602. Biased targets of this type shown at FIGS. 7(a) to (c), and their use in measurement, are described in, for example, the patent application publications mentioned above.

Further, as alluded to above, while FIGS. 7(a)-(c) depicts the features 608 lying over the features 602 (with or without a small bias of +d or −d applied), which is referred to as a "line on line" target having a bias in the region of zero, a target may have a programmed bias of P/2, that is half the pitch, such that each feature 608 in the upper periodic structure lies over a space 604 in the lower periodic structure. This is referred to as a "line on trench" target. In this case, a small bias of +d or −d may also be applied. The choice between "line on line" target or a "line on trench" target depends on the application.

Returning to FIG. 4, periodic structures 32, 33, 34, 35 may also differ in their orientation, as shown, so as to diffract incoming radiation in X and Y directions. In one example, periodic structures 32 and 34 are X-direction periodic structures with biases of +d, −d, respectively. Periodic structures 33 and 35 may be Y-direction periodic structures with offsets +d and −d respectively. While four periodic structures are illustrated, another embodiment may include a larger matrix to obtain desired accuracy. For example, a 3×3 array of nine composite periodic structures may have biases −4d, −3d, −2d, −d, 0, +d, +2d, +3d, +4d. Separate images of these periodic structures can be identified in the image captured by sensor 23.

Figure 5:
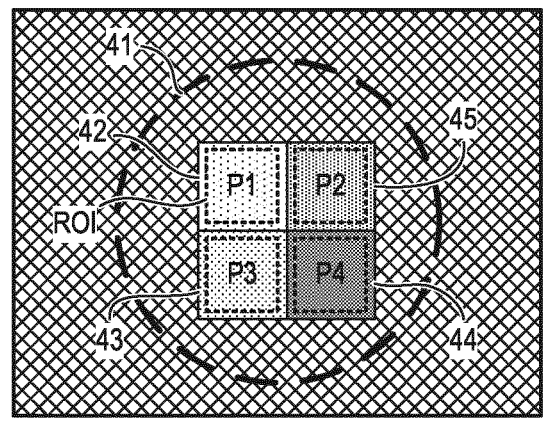
FIG. 5 depicts an image of the target of FIG. 4 obtained in the apparatus of FIG. 3.

FIG. 5 shows an example of an image that may be formed on and detected by the sensor 23, using the target of FIG. 4 in the apparatus of FIG. 3, using the aperture plates 13NW or 13SE from FIG. 3(d). While the sensor 19 cannot resolve the different individual periodic structures 32 to 35, the sensor 23 can do so. The dark rectangle represents the field of the image on the sensor, within which the illuminated spot 31 on the substrate is imaged into a corresponding circular area 41. Within this, rectangular areas 42-45 represent the images of the periodic structures 32 to 35. If the periodic structures are located in product areas, product features may also be visible in the periphery of this image field. Image processor and controller PU processes these images using pattern recognition to identify the separate images 42 to 45 of periodic structures 32 to 35. In this way, the images do not have to be aligned very precisely at a specific location within the sensor frame, which greatly improves throughput of the measuring apparatus as a whole.

Once the separate images of the periodic structures have been identified, the intensities of those individual images can be measured, e.g., by averaging or summing selected pixel intensity values within the identified areas. Intensities and/or other properties of the images can be compared with one another. These results can be combined to measure different parameters of the lithographic process. Overlay performance is an example of such a parameter.

Figure 6:
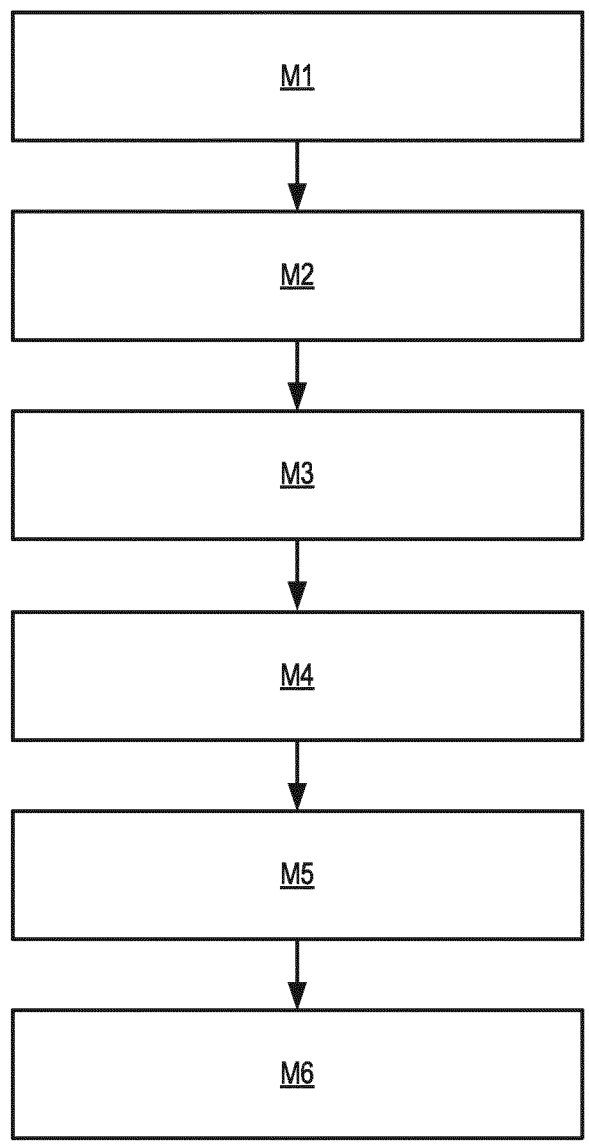
FIG. 6 is a flowchart showing the steps of an overlay measurement method using the apparatus of FIG. 3 and adaptable to embodiments of the present invention.

FIG. 6 illustrates how, using for example the method described in PCT patent application publication no. WO 2011/012624, overlay error between the two layers containing the component periodic structures 32 to 35 is measured through asymmetry of the periodic structures, as revealed by comparing their intensities in the +1 order and −1 order dark field images. At step M1, the substrate, for example a semiconductor wafer, is processed through the lithographic cell of FIG. 2 one or more times, to create a structure including the target comprising periodic structures 32-35. At M2, using the metrology apparatus of FIG. 3, an image of the periodic structures 32 to 35 is obtained using one of the first order diffracted beams (say −1). In an embodiment, a first illumination mode (e.g., the illumination mode created using aperture plate 13NW) is used. Then, whether by, for example, changing the illumination mode, or changing the imaging mode, or by rotating substrate W by 180° in the field of view of the metrology apparatus, a second image of the periodic structures using the other first order diffracted beam (+1) can be obtained (step M3). Consequently, the +1 diffracted radiation is captured in the second image. In an embodiment, the illuminated mode is changed and a second illumination mode (e.g., the illumination mode created using aperture plate 13SE) is used. In an embodiment, tool-induced artifacts like TIS (Tool Induced Shift) can be removed by doing the measurement at 0° and 180° substrate orientation.

Note that, by including only half of the first order diffracted radiation in each image, the 'images' referred to here are not conventional dark field microscopy images. The individual periodic structure features are not resolved. Each periodic structure will be represented simply by an area of a certain intensity level. In step M4, a region of interest (ROI) is identified within the image of each component periodic structure, from which intensity levels will be measured.

Having identified the region of interest P1, P2, P3, P4 for each respective individual periodic structure 32-35 and measured its intensity, the asymmetry of the periodic structure, and hence, e.g., overlay error, can then be determined. This is done by the image processor and controller PU in step M5 comparing the intensity values obtained for +1 and −1 orders for each periodic structure 32-35 to identify any difference in their intensity, i.e., an asymmetry. The term "difference" is not intended to refer only to subtraction. Differences may be calculated in ratio form. In step M6 the measured asymmetries for a number of periodic structures are used together with, if applicable, knowledge of the overlay biases of those periodic structures to calculate one or more performance parameters of the lithographic process in the vicinity of the target T. A performance parameter of interest is overlay. Other parameters of performance of the lithographic process can be calculated such as focus and/or dose. The one or more performance parameters can be fed back for improvement of the lithographic process, used to improve the measurement and calculation process of FIG. 6 itself, used to improve the design of the target T, etc.

Figure 8:
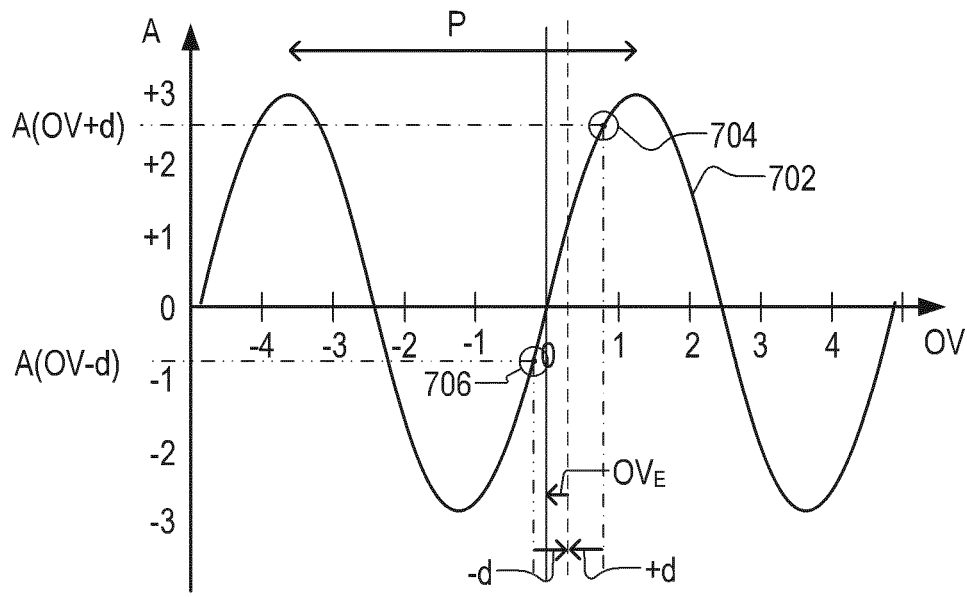
FIG. 8 illustrates principles of overlay measurement in an ideal target structure.

In an embodiment to determine overlay, FIG. 8 depicts a curve 702 that illustrates the relationship between overlay error OV and measured asymmetry A for an 'ideal' target having zero offset and no structural asymmetry within the individual periodic structures forming the overlay target. These graphs are to illustrate the principles of determining the overlay only, and in each graph, the units of measured asymmetry A and overlay error OV are arbitrary.

In the 'ideal' situation of FIGS. 7(*a*)-(*c*), the curve 702 indicates that the measured asymmetry A has a sinusoidal relationship with the overlay. The period P of the sinusoidal variation corresponds to the period (pitch) of the periodic structures, converted of course to an appropriate scale. The sinusoidal form is pure in this example, but can include harmonics in real circumstances. For the sake of simplicity, it is assumed in this example (a) that only first order diffracted radiation from the target reaches the image sensor 23 (or its equivalent in a given embodiment), and (b) that the experimental target design is such that within these first orders a pure sine-relation exists between intensity and overlay between upper and lower periodic structures results. Whether this is true in practice is a function of the optical system design, the wavelength of the illuminating radiation and the pitch P of the periodic structure, and the design and stack of the target.

As mentioned above, biased periodic structures can be used to measure overlay, rather than relying on a single measurement. This bias has a known value defined in the patterning device (e.g. a reticle) from which it was made, that serves as an on-substrate calibration of the overlay corresponding to the measured signal. In the drawing, the calculation is illustrated graphically. In steps M1-M5 of FIG. 6, asymmetry measurements $A_{+d}$ and $A_{-d}$ are obtained for component periodic structures having biases +d an −d respectively (as shown in FIGS. 7 (*b*) and 7 (*c*), for example). Fitting these measurements to the sinusoidal curve gives points 704 and 706 as shown. Knowing the biases, the true overlay error OV can be calculated. The pitch P of the sinusoidal curve is known from the design of the target. The vertical scale of the curve 702 is not known to start with, but is an unknown factor which we can call an overlay proportionality constant, K.

In equation terms, the relationship between overlay error $OV_E$ and intensity asymmetry A is assumed to be:

$$A_{\pm d} = K \sin(OV_E \pm d)$$

where overlay error $OV_E$ is expressed on a scale such that the target pitch P corresponds to an angle $2\pi$ radians. The term d is the grating bias of the target (or sub-target) being measured. Using two measurements of targets with different, known biases (e.g. +d and −d), the overlay error $OV_E$ can be calculated using:

$$OV_E = a\tan\left(\frac{A_{+d} + A_{-d}}{A_{+d} - A_{-d}} \cdot \tan(d)\right)$$

where $A_{+d}$ is an intensity asymmetry measurement of the +d biased target and $A_{-d}$ is an intensity asymmetry measurement of the −d biased target.

Although these measurement techniques are fast and relatively computationally simple (once calibrated), they rely on an assumption that the overlay/lateral shift is the only cause of asymmetry. That is, it assumes an 'ideal' situation with, for example, no structural asymmetry in the target. Any structural asymmetry in the stack, such as asymmetry of features within one or both of the overlaid periodic structures, also causes an asymmetry in the $1^{st}$ orders besides the overlay/lateral shift. This structural asymmetry which is not related to the overlay clearly perturbs the measurement, giving an inaccurate result.

As an example of structural asymmetry, one or more of the periodic structures of the target may be structurally deformed. For example, one or more side walls of periodic structure features (e.g., grating lines) of the target may not be vertical as intended. As another example, one or spaces between periodic structure features (e.g., grating spaces of trenches) of a target may be larger or smaller than as intended. Further, one or more features of a periodic structure of a target (e.g., grating lines) may have a smaller or larger width than as intended. Additionally, even where a difference from intended is uniform for one or more periodic structures of the target, that difference from intended may not be the same as for one or more other periodic structures of the target. Structural asymmetry in the lower periodic structure of a composite target is a common form of structural asymmetry. It may originate, for example, in the substrate processing steps such as chemical-mechanical polishing (CMP), performed after the lower periodic structure was originally formed.

Referring to FIG. 7(*d*), an example of structural asymmetry of a lower periodic structure is schematically depicted. The features and spaces in the periodic structures at FIG. 7 (*a*) to (*c*) are shown as perfectly square-sided, when a real feature and space would have some slope on a surface, and a certain roughness. Nevertheless they are intended to be at least symmetrical in profile. The features 602 and/or spaces 604 at FIG. 7 (*d*) in the lower periodic structure no longer have a symmetrical form at all, but rather have become distorted by, for example, one or more processing steps. Thus, for example, a bottom surface of each space 604 has become tilted. Side wall angles of the features and spaces have become asymmetrical also. When overlay is measured by the method of FIG. 6 using only two biased periodic structures, the structural asymmetry cannot be distinguished from overlay, and overlay measurements become unreliable as a result.

It has been further discovered that, in addition to or alternatively to structural asymmetry in a target, a stack difference between adjacent periodic structures of a target or between adjacent targets may be a factor that adversely affects the accuracy of measurement, such as overlay measurement. Stack difference may be understood as an undesigned difference in physical configurations between adjacent periodic structures or targets. Stack difference causes a difference in an optical property (e.g., intensity, polarization, etc.) of measurement radiation between the adjacent periodic structures or targets that is due to a cause other than overlay error, other than intentional bias and other than structural asymmetry common to the adjacent periodic structures or targets. Stack difference includes, but is not limited to, a thickness difference between the adjacent periodic structures or targets (e.g., a difference in thickness of one or more layers such that one periodic structure or target is higher or lower than another periodic structure or target designed to be at a substantially equal level), a refractive index difference between the adjacent periodic structures or targets (e.g., a difference in refractive index of one or more layers such that the combined refractive index for the one or more layers for one periodic structure or target is different than the combined refractive index for the one or more layers for of another periodic structure or target even though designed to have a substantially equal combined refractive index), a difference in material between the adjacent periodic structures or targets (e.g., a difference in the material type, material uniformity, etc. of one or more layers such that there is a difference in material for one periodic structure or target from another periodic structure or target designed to have a substantially same material), a difference in the grating period of the structures of adjacent periodic structures or targets (e.g., a difference in the grating period for one periodic structure or target from another periodic structure or target designed to have a substantially same grating period), a difference in depth of the structures of adjacent periodic structures or targets (e.g., a difference due to etching in the depth of structures of one periodic structure or target from another periodic structure or target designed to have a substantially same depth), a difference in width (CD) of the features of adjacent periodic structures or targets (e.g., a difference in the width of features of one periodic structure or target from another periodic structure or target designed to have a substantially same width of features), etc. In some examples, the stack difference is introduced by processing steps, such as CMP, layer deposition, etching, etc. in the patterning process. In an embodiment, periodic structures or targets are adjacent if within 200 μm of each other, within 150 μm of each other, within 100 μm of each other, within 75 μm of each other, within 50 μm of each other, within 40 μm of each other, within 30 μm of each other, within 20 μm of each other, or within 10 μm of each other.

The effect of stack difference (which can be referred to as grating imbalance between gratings) on intensity asymmetry measurements $A_{+d}$, $A_{-d}$ (where the subscript indicates the target bias of the target areas corresponding to the ROIs) can be generally formulated as:

$$A_{+d} = (K + \Delta K)\sin(OV_E + d)$$

$$A_{-d} = (K - \Delta K)\sin(OV_E - d)$$

wherein $\Delta K$ represents a difference in the overlay sensitivity attributable to the stack difference. And so, the overlay error $OV_E$ (assuming it is small) can be proportional to $$\frac{\Delta K}{K} d.$$

Stack difference may be considered to be a spatial stack parameter variation, i.e., a stack parameter variation over the substrate (target-to-target). Another issue which may be encountered is stack parameter process drift, where one or more of the stack parameters of a target drift from optimal over time, due to process drift. This can be considered to be a temporal stack parameter variation.

Now, in the face of structural asymmetry, stack difference, stack parameter process drift and any other process variabilities, it is desirable to derive a combination of target layout, measurement beam wavelength, measurement beam polarization, etc. that would yield an accurate measurement of the desired process parameter (e.g., overlay) and/or that yields measurement values of the desired process parameter that is robust to process variability. Thus, it is desirable, for example, to perform measurements using a desirably optimum selection of a target-measurement parameter combination so as to obtain more accurate process parameter measurement and/or that yields measurement values of the desired process parameter that is robust to process variability. This is because the measurement accuracy and/or sensitivity of the target may vary with respect to one or more attributes of the target itself and/or one or more attributes of the measurement radiation provided onto the target; for example: the wavelength of the radiation, the polarization of the radiation, and/or the intensity distribution (i.e., angular or spatial intensity distribution) of the radiation. In an embodiment, the wavelength range of the radiation is limited to one or more wavelengths selected from a range (e.g., selected from the range of about 400 nm to 900 nm). Further, a selection of different polarizations of the radiation beam may be provided and various illumination shapes can be provided using, for example, a plurality of different apertures. As such, it is desirable to determine a measurement profile which is optimized for a particular target.

The measurement profile comprises one or more parameters of the measurement itself, the one or more parameters of the measurement itself can include one or more parameters relating to a measurement beam and/or measurement apparatus used to make the measurement. For example, if the measurement used in a substrate measurement recipe is a diffraction-based optical measurement, one or more parameters of the measurement itself may include a wavelength of measurement radiation, and/or a polarization of measurement radiation, and/or measurement radiation intensity distribution, and/or an illumination angle (e.g., incident angle, azimuth angle, etc.) relative to the substrate of measurement radiation, and/or the relative orientation relative to a pattern on the substrate of diffracted measurement radiation, and/or number of measured points or instances of the target, and/or the locations of instances of the target measured on the substrate. The one or more parameters of the measurement itself may include one or more parameters of the metrology apparatus used in the measurement, which can include detector sensitivity, numerical aperture, etc.

In this context, a pattern measured (also referred to as a "target" or "target structure") may be a pattern that is optically measured, e.g., whose diffraction is measured. The pattern measured may be a pattern specially designed or selected for measurement purposes. Multiple copies of a target may be placed on many places on a substrate. For example, a substrate measurement recipe may be used to measure overlay. In an embodiment, a substrate measurement recipe may be used to measure another process parameter (e.g., dose, focus, CD, etc.) In an embodiment, a measurement profile may be used for measuring alignment of a layer of a pattern being imaged against an existing pattern on a substrate; for example, a measurement profile may be used to align the patterning device to the substrate, by measuring a relative position of the substrate.

A number of methods have been described for evaluating and optimizing target-measurement parameter combinations. Such methods are performed in advance of production. Therefore, once optimized, the chosen target-measurement parameter combination(s) will typically be used throughout a production run, i.e., a predetermined measurement profile will be used to measure a target of a corresponding target design in accordance with a predetermined target-measurement parameter combination. However, as discussed, there may be un-designed stack parameter variation in the target, leading to stack difference between targets and/or stack parameter process drift. For example, layer thickness of one or more layers within the stack may vary over the substrate (i.e., target-to-target) and/or over time (i.e., drift). One consequence of this stack parameter variation may be that the measurement profile is no longer optimal for the target. This can result in measurements of the target being inaccurate. Stack parameter variation may also be an indication of process control issues (e.g., process drift) generally, and therefore may be a useful process monitoring metric in itself.

Figure 9:
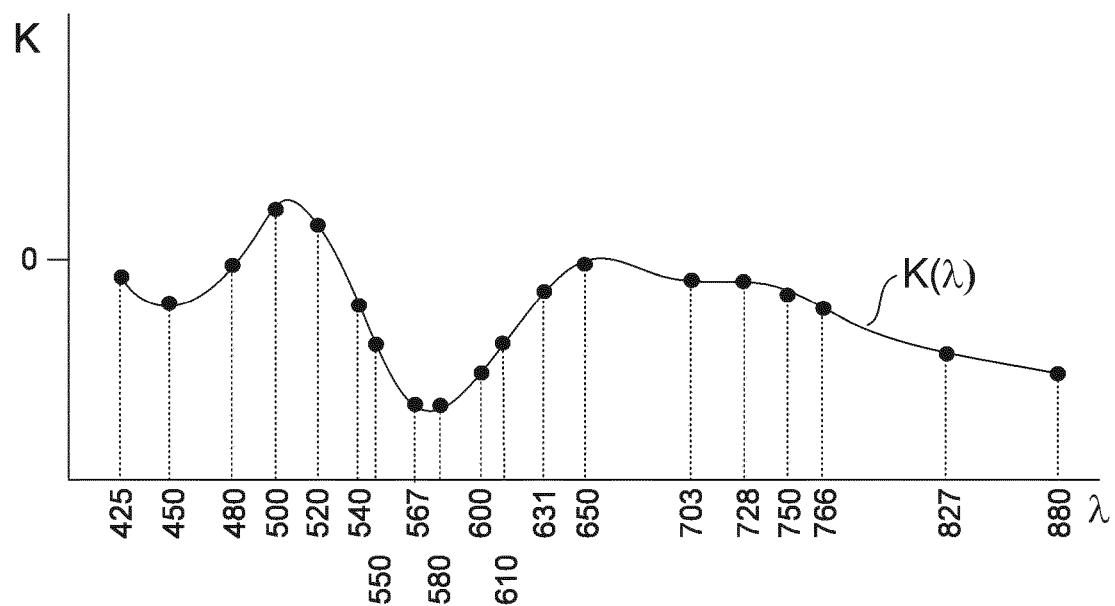
FIG. 9 is a graph of overlay sensitivity K against wavelength λ (nm) for a target, also referred to as a swing curve.

Methods for evaluating and optimizing target-measurement parameter combinations may comprise those which analyze target response sequence data describing the variation of target response with variation in the measurement profile, in particular one or more parameters of the measurement radiation such as wavelength (e.g., spectral sequence data). In an embodiment, the target response sequence data can represent an oscillatory dependence of measured data (e.g., an intensity metric obtained as field data (at an image plane) or pupil data (at pupil plane)) as a function of measurement radiation wavelength. FIG. 9 is an example graph of data for a target for measurement of an intensity metric, in this specific example overlay sensitivity K, at various wavelengths λ for a single polarization (in this case, linear X polarization). A curve K(λ) has been fitted through the data and so this representation can be called a swing curve. As will be appreciated, a graph need not be generated as just the data can be processed. A similar graph of data can be constructed for the same target for measurement at the various wavelengths for a different single polarization (e.g., linear Y polarization). In FIG. 9, stack sensitivity and overlay sensitivity are graphed for various measurement beam wavelengths. Further, while the polarizations here is linear X polarization, it can be a different polarization (such as linear Y polarization, left-handed elliptically polarized radiation, right-handed elliptically polarized radiation, etc.)

The intensity metric may be any suitable metric derived from the detected intensities, e.g., intensity asymmetry, overlay sensitivity K or stack sensitivity (SS) (also signal contrast). Stack sensitivity can be understood as a measure of how much the intensity of the signal changes as overlay changes because of diffraction between target (e.g., grating) layers. That is, in an overlay context, it detects the contrast between upper and lower periodic structure of an overlay target and thus represents a balance between diffraction efficiencies between the upper and lower periodic structure. It is thus an example measure of sensitivity of the measurement. In an embodiment, stack sensitivity is the ratio between intensity asymmetry and average intensity. In an embodiment, stack sensitivity can be formulated as SS=K L/$I_M$, wherein L is a user defined constant (e.g., in an embodiment, the value L is 20 nm and/or the value of the bias d) and $I_M$ is the mean intensity of the measurement beam diffracted by the target.

The example of FIG. 9 shows a swing curve for overlay sensitivity K(λ) as a function of wavelength λ, where $$K(\lambda) = \frac{A(\lambda)_{+d} - A(\lambda)_{-d}}{2d * df(\lambda)}$$

$A(\lambda)_{+d}$ and $A(\lambda)_{-d}$ are the intensity asymmetry measurements corresponding to biases +d and −d respectively, as a function of wavelength and df(λ) is a dose factor as a function of wavelength. The dose factor may be any function of source intensity and measurement time. In a specific embodiment, it may comprise the product of source intensity and integration time as a function of wavelength.

Figure 10:
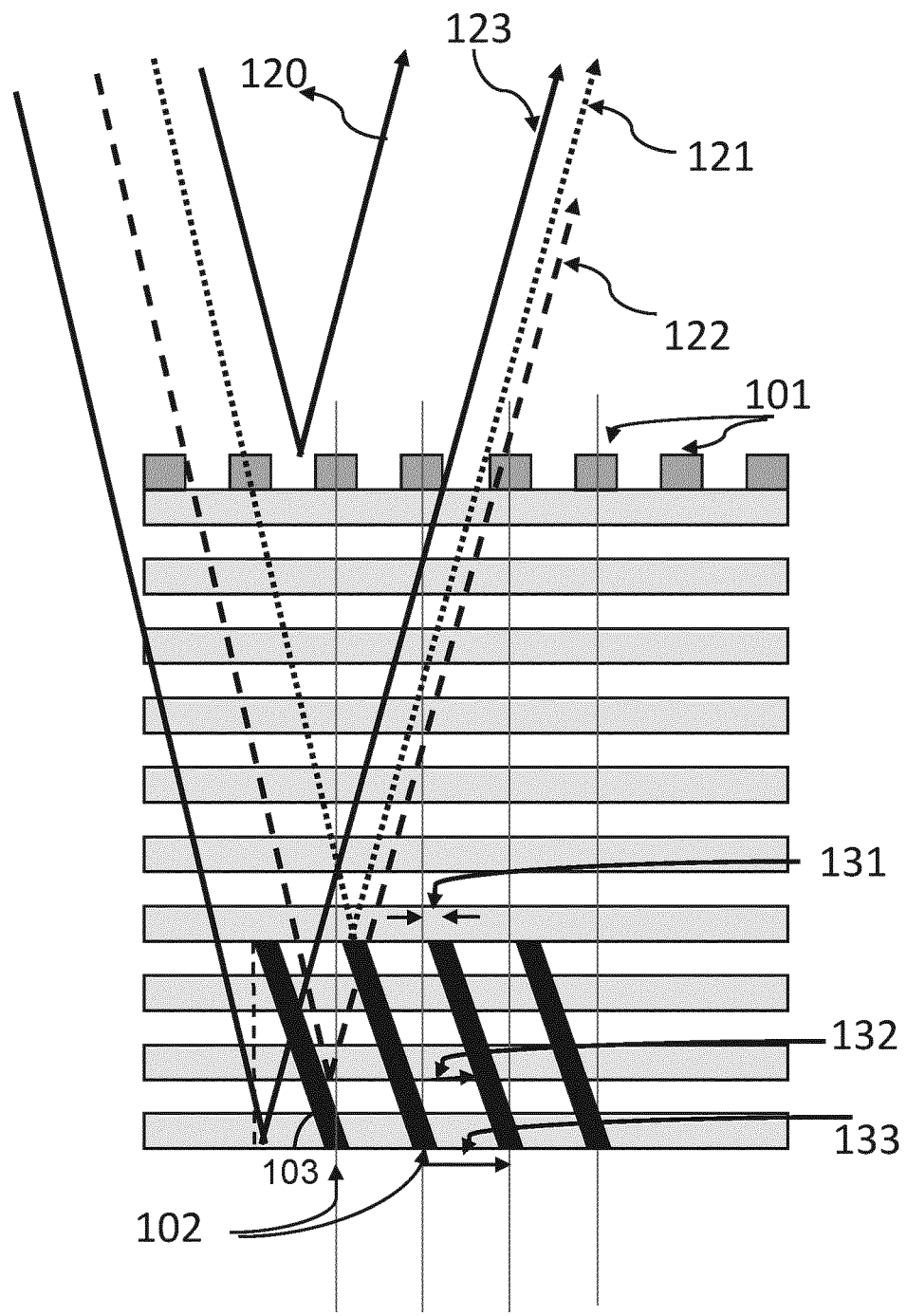
FIG. 10 shows a schematic of a cross section of a metrology target.

FIG. 10 describes an overlapping grating to be used in the metrology process. It comprises of top grating 101 and bottom grating 102. In this particular example, a particular form of geometrical asymmetry is highlighted, such as tilt of the bottom grating 102, as defined by angle 103. The top grating is formed on material 104, which in this particular example comprises alternate layers with different refractive indexes forming a part of the semiconductor device, which is a particular example and does not limit the stack in any way.

As indicated further in FIG. 10, due to the inclination of the bottom grating, there is the possibility that overlay, which is defined as a relative distance between the top grating 101 and bottom grating 102, to have different values, such as ov1, 131, or ov2, 132, or further ov3, 133. The radiation forming the radiation bundle impinging on the detector is formed from, by way of an example, rays 120, 121, 122 and 123, wherein ray 120 is radiation reflected by the top grating 101, radiation 121 is radiation reflected by top of bottom grating 102, radiation 122 is radiation reflected by a part of bottom grating 102 situated at a distance from the top grating of D+H, and radiation 123 is the radiation reflected by the bottom of the bottom grating 102. As it can be seen in this simplistic example of wave propagation in the metrology target, all radiation bundles 120, 121, 122 and 123 contribute to the radiation forming the radiation bundle impinging on the detector. Further, radiation bundle 120 together with radiation bundle 121 carry information about ov1, 131, radiation bundle 120 together with radiation bundle 122 carry information about ov2, 132, and radiation bundle 120 together with radiation bundle 123 carry information about ov3, 133. Therefore, the radiation impinging on the detector carry information about all the possible overlays that may be defined for a target comprising geometrical asymmetries, such as grating tilt, floor tilt, top tilt, in either bottom grating or top grating. It is therefore a problem of the current metrology process to be able to discern which overlay value is measured, in the cases where the gratings contain geometrical asymmetries, for example tilt.

Figure 11:
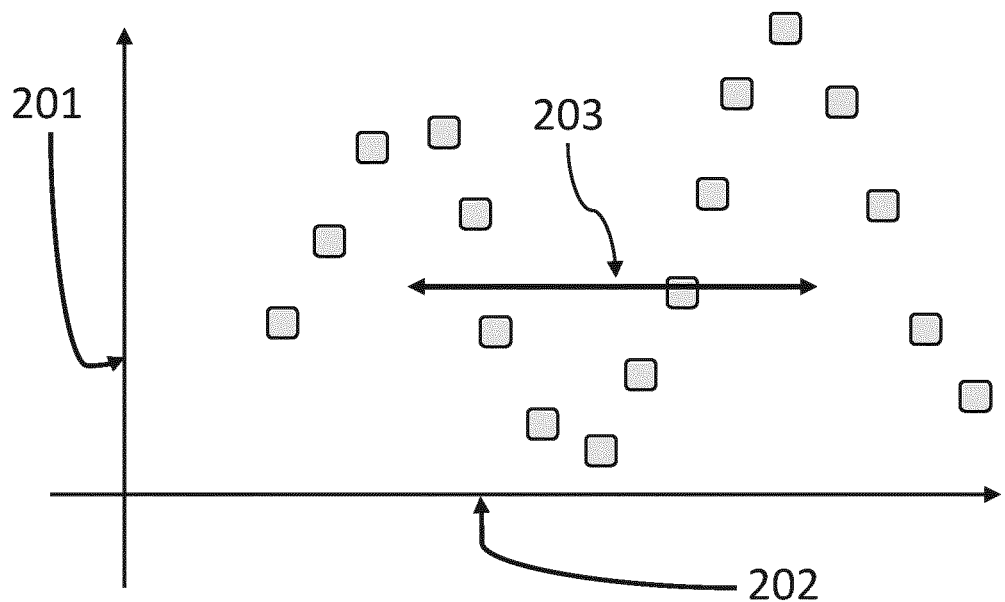
FIG. 11 shows a graph of a value inferred from a metrology measured as a function of a parameter of the metrology tool, such as wavelength.

The propagation of radiation in the metrology target may be further described as wave, having an intensity I, a frequency ω and phase φ, for example as in equation 1

$$I=A+B \cos(\omega t+\varphi) \quad \text{Equation 1}$$

Wherein A is an offset and B is amplitude parameter of the wave, frequency co is proportional to 2πn(D+H) (n refractive index and D+H as shown in FIG. 11, and t is the 1/wavelength of the light used as radiation. From this description, one may describe interference of wave 120 with the propagating waves 121, 122, and 123 according to equation 1. In other words, interference of wave 120 with each of the waves 121, 122 and 123 (and all the multitude of waves possible in view of equation 1 and stack geometrical parameters) are characterized by a specific frequency, in units of length, for example nanometers, depending on where the wave is reflected back to the detector.

FIG. 11 further depicts a parameter 201 inferred from a metrology measurement as a function of a parameter of the metrology apparatus, for example wavelength 202. This dependence takes the shape of a periodical variation of parameter 201 as function of wavelength. The period 203 is dependent of the total thickness of the stack, i.e. the distance between the top and bottom grating 101 and 102. The period is smaller for thicker stacks and larger for thinner stacks.

Figure 12:
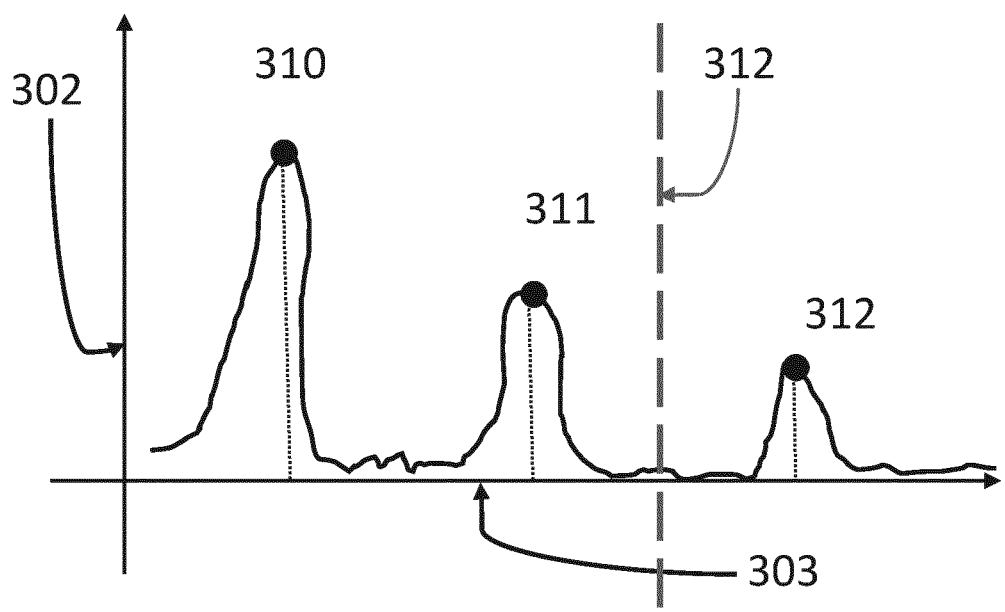
FIG. 12 shows a graph of a values inferred from a metrology step according to the invention measured as a function of a parameter of the metrology tool.

In a first aspect of the invention, it is proposed a method comprising measuring radiation reflected from a metrology target and decomposing the measured radiation in components. In an embodiment, decomposing the measured radiation is obtained with a Fourier transform of the measured radiation. In an embodiment, the measured radiation is radiation 201 as depicted in FIG. 11. The result of the decomposition of the measured result in components is further depicted in FIG. 12. FIG. 12 illustrates the Fourier transform of the element 201 as a function of wavelength, and it comprises amplitude of the components 302, as a function of the frequency (in nm for example). Individual components are 310, 311 and 312, which would correspond to each of the radiation formed by 120 and 121, 122 and 123. Detection of individual components is considered as part of the art, Fourier transform techniques allow identification of each of the individual frequency component of the signal depicted in FIG. 11. Frequency components may also be detected by other techniques, including but not limited to, wavelet transform and Laplace transform.

In a further aspect of the invention, there is provided a method to measure a parameter of a lithographic process comprising a) illuminating a metrology target with radiation, b) detecting scattered radiation from the target, c) changing a parameter of the metrology apparatus, d) repeating steps a) to c) for a multitude of values of the parameter of the metrology apparatus, and e) decomposing the radiation into components. In an embodiment of the invention, the decomposition is a Fourier transform. In an embodiment for the invention, the method selects the components lower than a threshold 320. In an embodiment, overlay is obtained using a reverse decomposition and utilizing only the selected components. In an embodiment the inverse decomposition is an inverse Fourier transform. Overlay is further obtained using state of the art methods, according to US applications US2012-0242970 incorporated herein by reference in their entirety. In an embodiment of the invention, the threshold 320 is chosen such that only one component, 310 in FIG. 11, remains and the remaining signal is used in the inverse decomposition step. In this case, the only overlay that is measured is ov1, 131, as the only contributing waves to the measured radiation are waves 120 and 121.

In a further aspect of the invention, obtaining the spectrum as depicted in FIG. 12 allows measurement of the phase of each of the harmonics obtained. In an embodiment, the overlay may be calculated from the difference in phase of the harmonics in FIG. 12, the difference in phase being obtained for the positive and negative first order of diffraction. The Fourier phase of the harmonic corresponding for a specific depth D1 is given by $\Phi_{\pm 1}=\theta(Z+D1)\pm i\varphi_{OVL}$. OVL is overlay value, D1 is the depth on which the harmonic is calculated, $\theta$ is a general phase and $\varphi_{OVL}$ is phase proportional to overlay. If one now obtains, as mentioned above, the difference between the Fourier phase of a specific harmonic, $\Phi_{+}-\Phi_{-1}=2\varphi_{OVL}=2\times 2\pi\times OVL/pitch$, which allows extraction of the overlay values solely from the phases of said Fourier harmonics. It is to be appreciated that such method of calculating overlay comprising obtaining the overlay value from a parameter proportional to the phase of the Fourier harmonic of a measured radiation parameter is specific to the current invention, and provides an alternative method of measuring overlay in a metrology process as to the known methods employed in the state of the art. In an aspect of the invention there is provided a method of measuring a parameter of a process comprising measuring radiation reflected from a metrology target, decomposing the measured radiation in components, calculating at least two phase values representative for each components and calculating the parameter from a relation between the said phases.

In a further aspect of the invention, there is provided a method to measure a parameter of a lithographic process comprising a) illuminating a metrology target with radiation, b) detecting scattered radiation from the target, c) changing a parameter of the metrology apparatus, d) repeating steps a) to c) for a multitude of values of the parameter of the metrology apparatus, e) applying a filter to the measurement obtain in step d). In an embodiment, the measurement obtained in step d) is decomposed in individual components. In an embodiment, filter 320 comprises an upper and a lower value, which defined an individual component. In an embodiment, filter 320 comprises an upper and a lower value, which defines an interval of components. In an embodiment, filter 320 is varied. An advantage of this aspect of the invention is measuring an overlay value at a particular depth defined by filter 320. If filter 320 is chosen to be D, then ov1, 131, is only measured, as all other components in the reflected radiation are removed. If filter 320 has an upper and a lower value around the component 311, then only the ov2, 132, would be measured. In this manner, overlay is measured and probed at different depth in the stack. In this manner, it is possible to measure accurate overlay at the specific depth in the stack, overlay which is not polluted by the contribution of other overlay values. If filter 320 is varied, the overlay values obtained at individual depths in the stack may provide a 3D overlay. Also, by an appropriate re-scaling of the measured values, the method in this aspect of the invention may provide 3D asymmetry information of the measured stack.

In a further aspect of the invention, it is provided a method of characterizing a lithographic process comprising obtaining a 3D asymmetry map of the bottom grating at a first target location, repeating obtaining the 3D asymmetry map for a multitude of targets, and obtaining based on the above measurement a map of target asymmetries for a wafer.

In FIG. 11, the measured signal 201 is obtained at a plurality of wavelengths 202. The accuracy of the decomposition according to the invention is improved with the number of sample points creating the graph of FIG. 11. However, each measurement point has an associated measurement time necessary to change the wavelength and perform the measurement. In this respect, a too dense sampling leads to an increase in the throughput of the metrology process, since the measurements needed are particularly lengthy. For example, in the case that the graph of FIG. 11 comprises only 1 component, the sampling rate for the number of wavelength is dictated by the Nyquist criteria. In addition to the theoretical sampling value given by the Nyquist criteria, an empirical approach may involve creating a sampling rate by design of experiments, for example in a recipe setup phase. In a further aspect of the invention, it is provided a method to select a parameter of a metrology apparatus comprising obtaining a first plurality of measurements at a first plurality of values of a parameter of a metrology apparatus and calculating a minimum second number of measurements and second values of the parameter of the metrology apparatus associated thereof such that the second values of the parameter of the metrology apparatus are less that the first values of the parameter of the metrology apparatus, while still resembling the key information of the first values of the parameter.

The methods described above allow measurement of overlay by employing a multitude of measurements at different values of a parameter of the metrology apparatus, for example a wavelength, a polarization state of the illuminating radiation or a multitude of angles of the incidence of the illuminating radiation. It is known in the art that in practical situations such calibration may not be suitable when the measurements are performed on another target, on the same wafer or on another wafers, as the processing conditions, although nominally identical, are in practice affected by un-desired variations, which may not be controlled. It is thus desirable that there is provided a method to obtained the most appropriate measurement conditions specific for each measured metrology target. State of the art comprises numerous such methods which are also known as recipe selection methods. In an aspect of the invention, the above described methodology for calculating overlay may be adapted to also provide the most suitable parameter of the metrology apparatus. Thus, in an aspect of the invention there is provided a method comprising illuminating a target with a radiation at multiple values of a parameter of said radiation, such as wavelength, polarization or angle of incidence, detecting said radiation at said multiple values of the said parameter and decomposing the measured radiation into components. Depending on which value of overlay is of interest, for example overlay 131 of FIG. 10, the relevant harmonic from said measured radiation is extracted. The other harmonics are also extracted. In a further aspect of the method of recipe selection, a dependence of the measured radiation for a single harmonic is re-calculated, assuming for example a simple sinusoidal depend on said harmonic. The method is not limited to such functional reconstruction, other methods of reconstructing a signal from a harmonic may be employed. In a further aspect of the method of recipe selection, the re-calculated dependencies of the measured signal based on individual harmonics are compared. In an embodiment, the optimum wavelength is the wavelength where the re-calculated dependency for the harmonic of interest (which corresponds to the overlay of interest) has a value above a first threshold and the value of the re-calculated dependency for a harmonic which is of no interest (as it adds and pollutes the signal) is below a second threshold.

In an embodiment, the selection is obtained numerically based on a search algorithm having as input values for the first threshold and the second threshold. In an embodiment, the selection may be performed by a skilled operator. In a further embodiment of the method to select the most suitable wavelength, an arbitrary wavelength is selected. Further, a second wavelength is selected such that it is a distance within a period of one of the re-calculated dependencies. In an embodiment, the value of interest is calculated based on an average value of the two selected wavelengths. In an embodiment, the distance between the two wavelengths is half the period of at least one of the re-calculated dependencies. In another embodiment, the distance is one third of the distance between the re-calculated dependencies.

In yet another embodiment, the suppression of the contribution of the un-desired harmonics to the re-calculated signal or to the measurement of overlay may be performed by changing the bandwidth of the illumination radiation, such that the components leading to un-desired harmonics are suppressed. In an embodiment, the bandwidth is filtered with a rectangular filter characteristic, wherein the bandwidth is matching the period or a multiple of the period of a harmonic of interest. In an embodiment, the harmonic of interest is a harmonic which endues un-desired contributions.

The above description of the invention is suitable for metrology where a single value of the radiation is detected for each value of the parameter of the metrology apparatus. For example, in the case of dark field metrology, an average value of the intensity of the dark field image of a target is measured at multiple wavelengths. It is recognized that a metrology apparatus, as described in FIG. 3(*a*), may also provide metrology measurements from a complementary sensor to that used when acquiring images, for example metrology obtained using sensor 19 of FIG. 3(*a*). Such measurements are complementary of the measurements obtained by sensor 23 of FIG. 3(*a*), and contained additional information, for example angle information.

In a further aspect of the invention it is proposed to use the information available in the complementary measuring unit. The method is similar to the method described in relation to FIGS. 10 to 12, wherein the decomposition is performed on the measurements obtained in the detection complementary to image detection. The elements of the decomposition are determined by basic building blocks of the propagations of light as present in the complementary plane to image measurements. Such building blocks may be calculated based on a theoretical model which takes into account the propagation and summation of all possible radiation path with a target structure. In this respect, the method needs an additional optimization step with respect to the method wherein the radiation is detected in the image plane of said metrology apparatus. The optimization step comprises determining the relevant elements forming a signal in said complementary plane to the image plane. In an aspect of the invention related to measurements in the complementary plane to the image plane of the metrology apparatus, the elements forming the basis of decomposition of the measured signal are the spatial modes or components of the radiation scattered by the target. An important advantage of such method is the fact that the contribution from the various radiation paths within the target structure are captured simultaneously, fact which may improve the throughput of the metrology process significantly.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

Further embodiments of the present invention are described in below numbered clauses:

1. A method comprising measuring radiation reflected from a metrology target and decomposing the measured radiation in components.
2. A method according to clause 1 wherein decomposing the measured radiation is obtained with a Fourier transform of the measured radiation.
3. A method to measure a parameter of a lithographic process comprising
a) illuminating a metrology target with radiation,
b) detecting scattered radiation from the target,
c) changing a parameter of the metrology apparatus,
d) repeating steps a) to c) for a multitude of values of the parameter of the metrology apparatus, and
e) decomposing the radiation into components.
4. A method according to clause 3 wherein the decomposition is a Fourier transform.
5. A method according to clause 3 wherein the method further comprises selecting the components smaller than a threshold 320.

6. A method according to clause 3 wherein the overlay is generated using a reverse decomposition and utilizing only the selected components.

7. A method to measure a parameter of a lithographic process comprising
a) illuminating a metrology target with radiation,
b) detecting scattered radiation from the target,
c) changing a parameter of the metrology apparatus,
d) repeating steps a) to c) for a multitude of values of the parameter of the metrology apparatus,
e) applying a filter to the measurement obtained in step d).

8. A method according to clause 7 wherein the measurement obtained in step d) is decomposed in individual components.

9. A method according to clause 7 wherein filter 320 comprises an upper and a lower value, which defines an individual component.

10. A method according to clause 7 wherein filter 320 comprises an upper and a lower value, which defines an interval of components.

11. A method according to clause 7 wherein filter 320 is varied.

12. A method of characterizing a lithographic process comprising obtaining a 3D asymmetry map of the bottom grating at a first target location, repeating obtaining the 3D asymmetry map for a multitude of targets, and obtaining based on the above measurement a map of target asymmetries for a wafer.

13. A method to select a parameter of a metrology apparatus comprising obtaining a first plurality of measurements at a first plurality of values of a parameter of a metrology apparatus and
calculating a minimum second number of measurements and second values of the parameter of the metrology apparatus associated thereof
such that the second values of the parameter of the metrology apparatus are less that the first values of the parameter of the metrology apparatus.

14. A computer program comprising program instructions operable to perform the method of any of clauses 1 to 13 when run on a suitable apparatus.

15. A non-transient computer program carrier comprising the computer program of clause 14.

16. A method of measuring a parameter of a process comprising measuring radiation reflected from a metrology target,
decomposing the measured radiation in components,
calculating at least two phase values representative for each components and
calculating the parameter from a relation between the said phases.

17. A recipe selection method for metrology processes comprising
illuminating a metrology target at a multitude of parameters of the illumination source, detecting a scattered radiation by the metrology target at said multitude of parameters of the illumination source,
decomposing into components the measured radiation,
re-calculating a dependence of the measured radiation corresponding to at least one of the components and
selecting a parameter of the of the illumination source for a value of the dependency determined in relation to a threshold.

18. A method comprising
measuring radiation reflected from a metrology target and
decomposing the measured radiation in spatial components.

19. A method according to clause 18 wherein
the measured radiation is obtained in a plane complementary to the image plane of the metrology apparatus.

The terms "radiation" and "beam" used herein encompass all types of electromagnetic radiation, including ultraviolet (UV) radiation (e.g., having a wavelength of or about 365, 355, 248, 193, 157 or 126 nm) and extreme ultra-violet (EUV) radiation (e.g., having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

The foregoing description of the specific embodiments reveals the general nature of embodiments of the invention such that others can, by applying knowledge within the skill of the art, readily modify and/or adapt for various applications such specific embodiments, without undue experimentation, without departing from the general concept of the present invention. Therefore, such adaptations and modifications are intended to be within the meaning and range of equivalents of the disclosed embodiments, based on the teaching and guidance presented herein. It is to be understood that the phraseology or terminology herein is for the purpose of description by example, and not of limitation, such that the terminology or phraseology of the present specification is to be interpreted by the skilled artisan in light of the teachings and guidance.

The breadth and scope of the present invention should not be limited by any of the above-described exemplary embodiments, but should be defined only in accordance with the following claims and their equivalents.

The invention claimed is:

1. A method for determining overlay at plural heights of a non-flat, buried metrology target having another metrology target disposed thereon, the method comprising:
   measuring radiation reflected by metrology targets;
   inferring data of a parameter of the buried metrology target from the measurement as a function of the parameter verses wavelength, which yields a periodical variation of the parameter; and
   decomposing the periodical variation of the parameter to isolate the plural heights of the buried metrology target as a function of amplitude verses wavelength.

2. The method of claim 1, wherein the decomposing comprises performing a Fourier transform, a wavelet transform, or a Laplace transform.

3. The method of claim 1, wherein the decomposing to isolate the plural heights of the buried metrology target comprises determining a top and a bottom of the buried metrology target.

4. The method of claim 1, wherein the decomposing to isolate the plural heights of the buried metrology target comprises determining a tilt of the buried metrology target.

5. The method of claim 1, wherein the decomposing to isolate the plural heights of the buried metrology target comprises determining an overlay between the metrology targets.

6. The method of claim 1, wherein the decomposing to isolate the plural heights of the buried metrology target comprises determining an intermediate height of the buried metrology target.

7. The method of claim 1, wherein the decomposing comprises filtering.

8. The method of claim 7, wherein the filtering comprises using an upper and a lower value that defines an individual component.

9. The method of claim 7, wherein the filtering comprises using an upper and a lower value that defines plural components.

10. The method of claim 7, further comprising varying the filtering.

11. A metrology system for determining overlay at plural heights of a non-flat, buried metrology target having another metrology target disposed thereon, the metrology system comprising:
- an illumination source configured to direct a beam of radiation at a metrology target;
- a detector configured to detect scattered radiation from the target; and
- a controller configured to:
- measure the detected radiation;
- infer data of a parameter of the buried metrology target from the measurement as a function of the parameter verses wavelength, which yields a periodical variation of the parameter; and
- decompose the periodical variation of the parameter to isolate the plural heights of the buried metrology target as a function of amplitude verses wavelength.

12. The metrology system of claim 11, wherein the decomposing comprises performing a Fourier transform, a wavelet transform, or a Laplace transform.

13. The metrology system of claim 11, wherein the decomposing to isolate the plural heights of the buried metrology target comprises determining a top and a bottom of the buried metrology target.

14. The metrology system of claim 11, wherein the decomposing to isolate the plural heights of the buried metrology target comprises determining a tilt of the buried metrology target.

15. The metrology system of claim 11, wherein the decomposing to isolate the plural heights of the buried metrology target comprises determining an overlay between the metrology targets.

16. The metrology system of claim 11, wherein the decomposing to isolate the plural heights of the buried metrology target comprises determining an intermediate height of the buried metrology target.

17. The metrology system of claim 11, wherein the decomposing comprises filtering.

18. The metrology system of claim 17, wherein the filtering comprises using an upper and a lower value that defines an individual component.

19. The metrology system of claim 17, wherein the filtering comprises using an upper and a lower value that defines plural components.

20. A lithography system comprising the metrology system of claim 11.

* * * * *

UNITED STATES PATENT AND TRADEMARK OFFICE
CERTIFICATE OF CORRECTION

| | |
|---|---|
| PATENT NO. | : 12,105,432 B2 |
| APPLICATION NO. | : 17/625640 |
| DATED | : October 1, 2024 |
| INVENTOR(S) | : Javaheri et al. |

It is certified that error appears in the above-identified patent and that said Letters Patent is hereby corrected as shown below:

In the Specification

In Column 3, Line 16, delete "and".

In Column 3, Line 18, delete "target." and insert -- target; --, therefor.

In Column 3, Line 21, delete "wavelength." and insert -- wavelength; and --, therefor.

In Column 5, Line 7, delete "B" and insert -- B. --, therefor.

In Column 10, Line 41, delete "16 μm." and insert -- 16 μm x 16 μm. --, therefor.

Signed and Sealed this
Eleventh Day of March, 2025

Coke Morgan Stewart
*Acting Director of the United States Patent and Trademark Office*